United States Patent
Higashiura

(10) Patent No.: US 7,025,857 B2
(45) Date of Patent: Apr. 11, 2006

(54) PLASMA TREATMENT APPARATUS, MATCHING BOX, IMPEDANCE MATCHING DEVICE, AND COUPLER

(75) Inventor: Tsutomu Higashiura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 22 days.

(21) Appl. No.: 10/498,222

(22) PCT Filed: Dec. 13, 2002

(86) PCT No.: PCT/JP02/13094

§ 371 (c)(1),
(2), (4) Date: Jun. 10, 2004

(87) PCT Pub. No.: WO03/054940

PCT Pub. Date: Jul. 4, 2003

(65) Prior Publication Data

US 2005/0011450 A1    Jan. 20, 2005

(30) Foreign Application Priority Data

Dec. 13, 2001    (JP) ............................. 2001-380183

(51) Int. Cl.
*C23F 1/02*      (2006.01)
*C23C 16/00*     (2006.01)

(52) U.S. Cl. .................. 156/345.44; 156/345.45; 118/723 E; 118/723 I

(58) Field of Classification Search ........... 156/345.44, 156/345.45, 345.47, 345.43; 118/723 E, 118/723 I, 733; 315/111.71, 111.21
See application file for complete search history.

(56) References Cited

U.S. PATENT DOCUMENTS 5,997,687 A * 12/1999 Koshimizu ............. 156/345.44
2004/0250770 A1 * 12/2004 Nakano et al. .......... 118/723 E

* cited by examiner

*Primary Examiner*—Tuyet Thi Vo
(74) *Attorney, Agent, or Firm*—Crowell & Moring LLP

(57) ABSTRACT

A matching box is provided with a contact device insertion section serving as a slot into which a contact device is inserted. When the matching box is fixed on the outer wall of the side surface of a vacuum container, the matching box is positioned so as to be in a state where a space margin is provided between itself and a power feeding bar. Thereafter, electric contact between the external circuit and the power feeding bar is established by inserting a contact device into the contact device insertion section. A socket 40 provided at the output portion of an impedance matching device has, at the center portion of a metal body 40a formed into a cylindrical structure, an insertion hole 41 for inserting a power feeding bar 32 thereinto to support it A cover layer 42 made of an insulation material is provided on the inner wall of the insertion hole 41, thereby electrically insulating the insertion hole 41 from the power feeding bar 32. A high frequency electricity generated by a second high frequency power source 51 is conducted to the power feeding bar 32 by inductive coupling.

8 Claims, 8 Drawing Sheets

PLASMA TREATMENT APPARATUS, MATCHING BOX, IMPEDANCE MATCHING DEVICE, AND COUPLER

TECHNICAL FIELD

The present invention relates to a plasma treatment apparatus which applies a process such as a film forming process to a process target by using plasma.

BACKGROUND ART

In the manufacturing process of a semiconductor substrate or the like, a plasma treatment apparatus for applying a surface process to such a substrate by using plasma may be used. As a plasma treatment apparatus, for example, an apparatus for applying a Chemical Vapor Deposition (CVD) process is known. Among plasma treatment apparatuses, a parallel plate type plasma treatment apparatus is widely used because it is excellent in process evenness and the apparatus structure is relatively simple.

A plasma treatment apparatus is provided with an electrode for turning a material gas and the like into plasma when a high frequency electricity is supplied into a vacuum container in which a surface process for a substrate is performed.

There is a case where a high frequency power source and the electrode are electrically connected by inserting a power feeding bar which leads to the electrode, to a socket, in order to supply a high frequency electricity to the vacuum container. This socket has a multi-surface contact arranged thereinside, and is provided at, for example, the output portion of an impedance matching device to become capable of transmitting a high frequency electricity sent from the high frequency power source to the power feeding bar. The multi-surface contact has, for example, a ring shape, and has multiple contact pins whose surface has a sphere shape. These contact pins are biased toward the inside of the socket by springs. When the power feeding bar is inserted into this socket, these contact pins electrically connect the power feeding bar and the socket by elastically holding the power feeding bar.

By arranging, as described above, the multi-surface contact at the electric contact interface between the socket provided at the output portion of the impedance matching device and the power feeding bar, attempts have been made to secure a predetermined effective contact area and contact pressure.

There is a method which employs a matching box, for electrically connecting the power feeding bar, which leads to the electrode, and an external electric circuit The matching box is fixed on the external wall of the vacuum container, and has contact pins in the interior of the vacuum container. The power feeding bar connected to the electrode is to be connected to the contact pins. An external power source is to be connected to the contact pins via an external terminal. In some case, the contact pins may be fitted into the power feeding bar. In this case, according to a conventional manner, as shown in FIG. 8 for example, contact pins 70a for connecting a matching box 70 and a power feeding bar 71 are initially provided in a protruded manner on the external portion of the matching box 70. In attaching the power feeding bar 71 to the matching box 70, the contact pins 70a are firstly fitted into fitting holes 71a provided to the power feeding bar 71, and then the body of the matching box 70 is screwed and fixed on a frame or the like provided on the external wall of the vacuum container.

The impedance matching device and the matching box accommodating the impedance matching device are attached to and detached from the plasma treatment apparatus for maintenance sake or modification of electric characteristics. The attaching and detaching actions cause a problem that the contact area of the power feeding bar and multi-surface contact changes to cause contact resistance variation. Since the contact resistance variation changes the electric characteristics of the transmission path of high frequency electricity, plasma becomes ununiform and the loss due to resistance components increases.

In order to stabilize the contact resistance between the power feeding bar and the socket, it is preferred that a plating process be applied to the surface of the power feeding bar. However, in some case, the power feeding bar is directly connected to the electrode. In this case, the plating process is difficult to apply from the structural aspect. Further, portions being in contact with a vacuum area could not be plated because plating could be a cause for contamination.

Furthermore, in a case where the contact pins protuberantly provided on the matching box are to be connected to the power feeding bar by fitting the contact pins into the power feeding bar, the fitting of the contact pins must be carried out earlier than the screwing of the matching box. Since the matching box weighs considerably, as much as approximately 10 Kg to 20 Kg in general, it has been difficult to precisely insert the contact pins into the power feeding bar. Moreover, a strong impact is applied to the power feeding bar unless the heavy matching box is appropriately supported until the matching box is screwed. Because of this, there has been a problem that the contact pins connecting the matching box and the power feeding bar and the power feeding bar itself are easily destroyed

DISCLOSURE OF INVENTION

The present invention was made in view of the above circumstances, and it is an object of the present invention to provide a plasma treatment apparatus to which an electric circuit can be attached physically or electrically stably.

It is another object of the present invention to provide a plasma treatment apparatus having a high reliability.

To achieve the above objects, a plasma treatment apparatus according to a first aspect of the present invention comprises:

a vacuum container in which a process target is processed with use of a gas turned into plasma;

plasma generation electrodes which are arranged in the vacuum container;

high frequency power sources which generate a high frequency electricity to be supplied to the plasma generation electrodes;

power feeding bars which conduct a high frequency electricity generated by the high frequency power sources to the plasma generation electrodes;

matching boxes which include matching circuits for matching input impedances to the plasma generation electrodes and output impedances of the high frequency power sources; and contact devices which establish electric contact between output terminals of the matching circuits for outputting a high frequency electricity and input terminals of the power feeding bars for inputting the high frequency electricity, wherein the contact devices are structured such that they can establish electric contact between the matching circuits and the power feeding bars after positioning of the power feeding bars and the matching boxes is completed.

According to this structure, by establishing electric contact between the matching circuits and the power feeding bars by contact devices after positioning of the power feeding bars and the matching boxes is completed, it is possible to reduce the impact to be applied to the power feeding bars. This makes it possible to physically stably attach electric circuits such as the matching circuits included in the matching boxes.

It is preferred that positioning of the power feeding bar and the matching box is completed by attaching the matching box onto an outer wall of the vacuum container.

It is preferred that the matching box comprises a slot into which the contact device can be inserted, and electric contact between the matching circuits and the power feeding bars is established by inserting the contact device into the slot in a state where the matching box is attached to the outer wall of the vacuum container.

The plasma treatment apparatus may comprise a heater which heats the process target to be processed in the vacuum container, and the contact device may be structured such that it can establish electric contact for supplying the heater with electricity supplied from a commercial power source.

The matching box comprises, for example, a coupler which inserts thereinto the power feeding bar connected to the plasma generation electrode in order to fix and support the power feeding bar to and by the impedance matching device, and the coupler comprises a cover layer made of an insulation material at an insertion portion of the power feeding bar. This connecting device is capable of supplying a high frequency electricity generated by the high frequency power source to the plasma generation electrode by inductive coupling with the power feeding bar.

A matching box according to a second aspect of the present invention is a matching box which is applied to a plasma treatment apparatus for processing a process target with use of a gas turned into plasma and which comprises matching circuits for matching an output impedance of a high frequency power source and an input impedance of a plasma load, wherein positioning of a power feeding bar connected to an electrode provided in a vacuum container is completed by attaching the matching box to an outer wall of the vacuum container in which a process target is processed, and the matching box comprises a slot into which a contact device is inserted thereby establishing electric contact between the matching circuit and the power feeding bar.

A plasma treatment apparatus according to a third aspect of the present invention comprises:

a vacuum container in which a process target is processed with use of a gas turned into plasma;

a plasma generation electrode which is arranged in the vacuum container;

a high frequency power source which generates a high frequency electricity to be supplied to the plasma generation electrode;

an impedance matching device which is connected between the plasma generation electrode and the high frequency power source in order to match an impedance to the plasma generation electrode and an output impedance of the high frequency power source; and a coupler which inserts thereinto a power feeding bar connected to the plasma generation electrode to fix and support the power feeding bar to and by the impedance matching device, wherein the coupler comprises a cover layer made of an insulation material at an insertion portion of the power feeding bar.

According to this structure, since a cover layer made of an insulation material is provided to a portion of a coupler to which a power feeding bar is inserted, there is no need of concerning for the contact resistance at the time of inserting the power feeding bar and circuits such as an impedance matching device and a high frequency power source can therefore be attached electrically stably.

More specifically, it is preferred that the coupler is capable of supplying a high frequency electricity generated by the high frequency power source to the plasma generation electrode by inductive coupling with the power feeding bar.

An impedance matching device according to a fourth aspect of the present invention is an impedance matching device which is applied to a plasma treatment apparatus for processing a process target with use of a gas turned into plasma, and which matches an output impedance of a high frequency power source and an input impedance of a plasma load, the impedance matching device comprising a coupler which inserts thereinto a power feeding bar connected to an electrode provided in a vacuum container in which a process target is processed, in order to fix the power feeding bar, wherein the coupler comprises a cover layer made of an insulation material at an insertion portion of the power feeding bar.

A coupler according to a fifth aspect of the present invention is a connecting device which fixes and supports a power feeding bar connected to an electrode provided in a vacuum container for processing a process target with use of a gas turned into plasma, in order to connect the power feeding bar to an electric circuit other than the vacuum container, the coupler comprising a cover layer which is made of an insulation material at a part where the coupler contacts the power feeding bar.

It is preferred that the coupler comprises an insertion hole into which the power feeding bar is inserted to be fixed and supported, and the cover layer is provided on an inner surface of the insertion hole.

It is preferred that the coupler conducts a high frequency electricity generated by a high frequency power source by inductive coupling with the power feeding bar.

Further, it is preferred that the coupler is grounded via a capacitor for compensating for a reactance component of an impedance and for insulating a direct current component.

BEST MODE FOR CARRYING OUT THE INVENTION

A plasma treatment apparatus according to an embodiment of the present invention will be specifically explained below with reference to the drawings.

Figure 1:
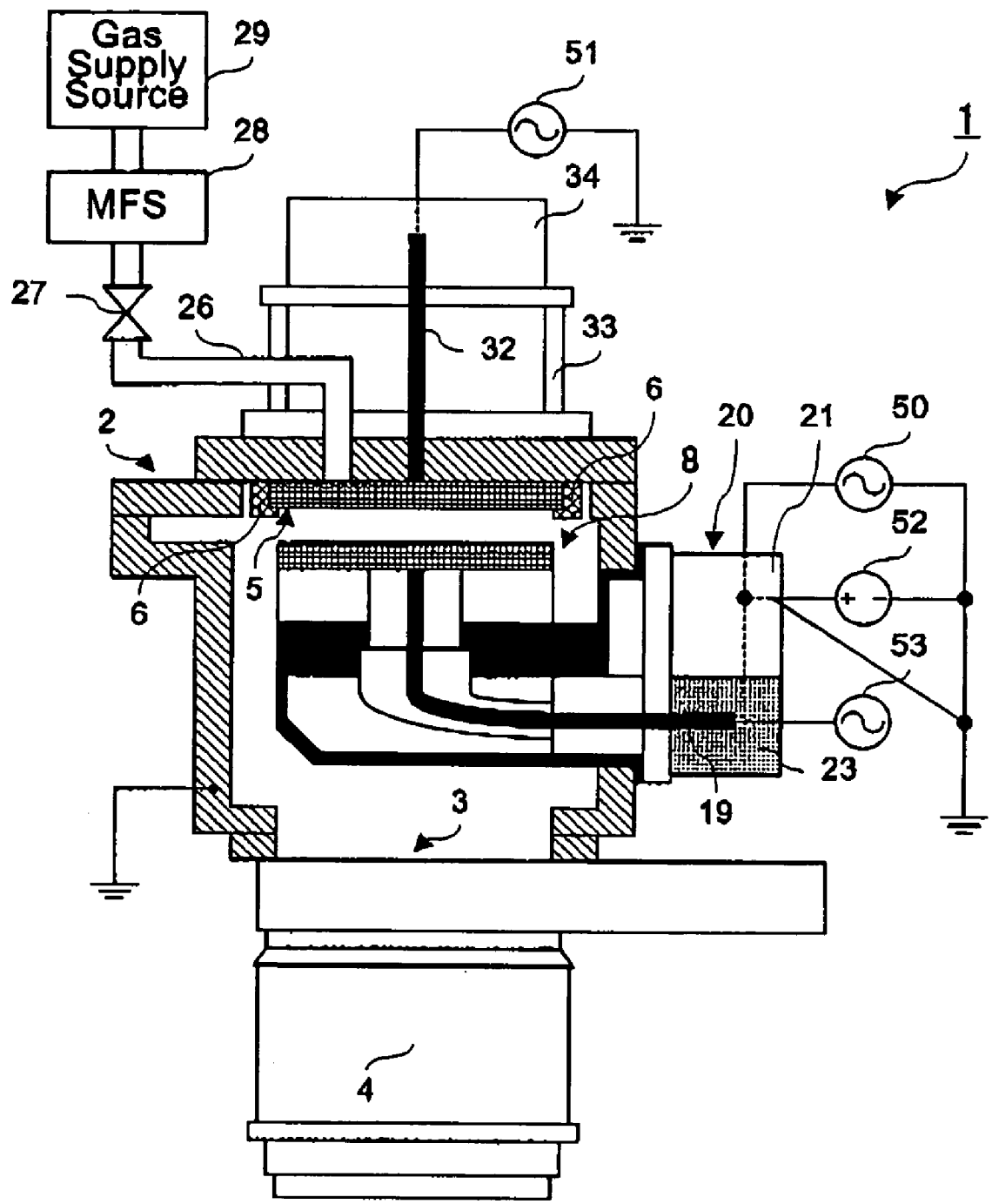
FIG. 1 is a diagram showing an example of a structure of a plasma treatment apparatus according to an embodiment of the present invention.

With reference to FIG. 1, a plasma treatment apparatus 1 comprises a cylindrical vacuum container 2. The vacuum container 2 is constituted by a conductive material such as aluminum, etc. to which an almite process (anodic oxidation process) is applied. The vacuum container 2 is grounded.

An evacuation pipe 3 is connected to the bottom of the vacuum container 2. The evacuation pipe 3 is connected to a pump 4. The pump 4 is an evacuation device constituted by a turbo molecular pump (TMP), and can evacuate the vacuum container 2 of air to a predetermined pressure.

Figure 2:
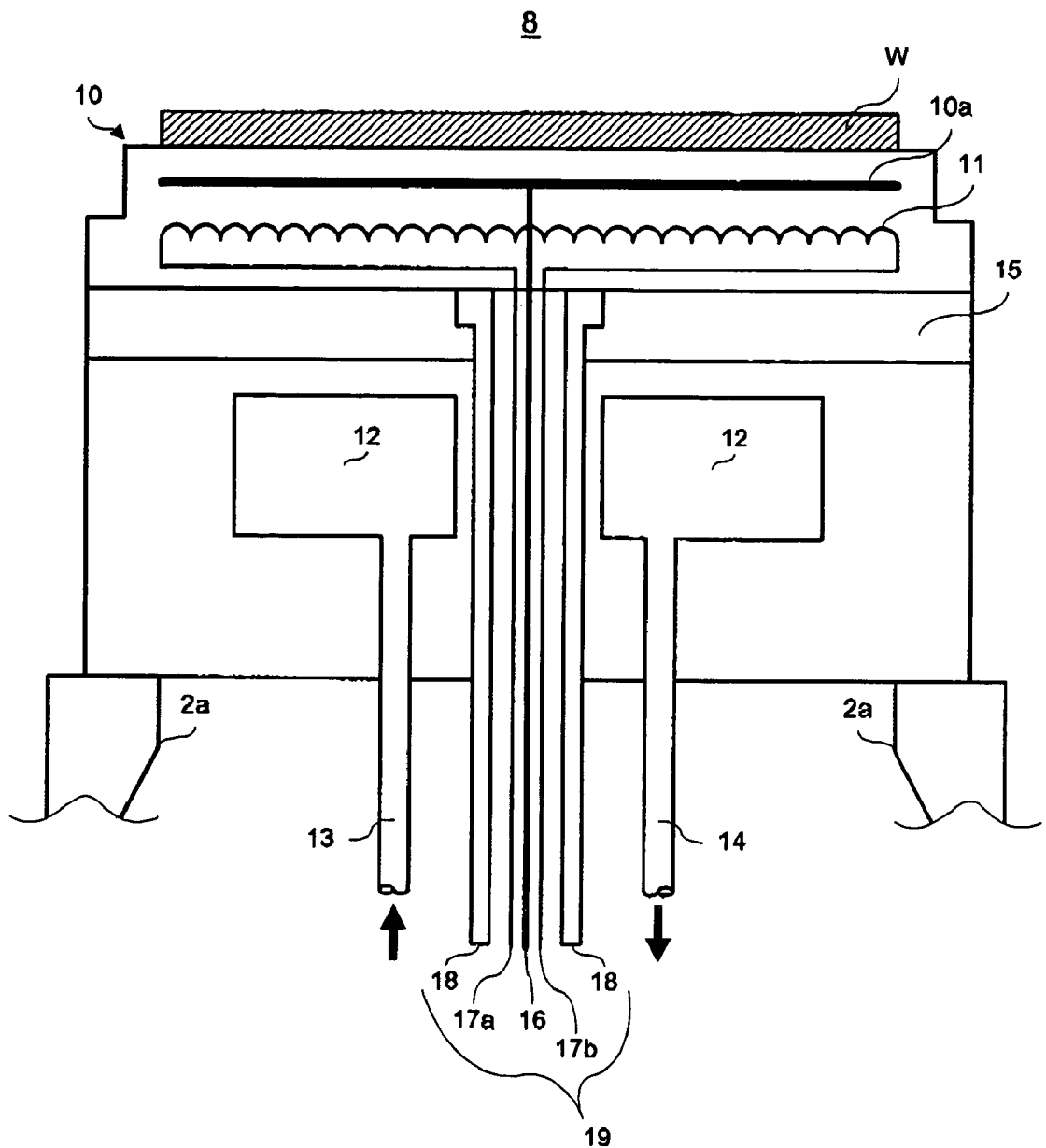
FIG. 2 is a diagram showing an example of a structure of a susceptor, etc. provided at a lower portion of a vacuum container.

A susceptor 8 for placing a wafer W thereon is provided at the lower central portion of the vacuum container 2. FIG. 2 is a diagram showing an example of the structure of the susceptor 8. The susceptor 8 is constituted by, for example, aluminum nitride (AlN) formed into a cylindrical shape, and has an electrostatic chuck 10 placed and fixed on the upper surface thereof thereby functioning as a lower electrode for generating plasma in the process space inside the vacuum container 2.

The electrostatic chuck 10 is structured by arranging a conductive sheet 10a such as a copper foil sheet or the like between two upper and lower insulation layers made of, for example, polyimide films, and attracts a wafer W by Coulomb force to fix the wafer W thereon.

A heater 11 for heating a wafer W to a predetermined temperature is provided in the susceptor 8. A refrigerant jacket 12 for circulating a refrigerant is provided so as to sandwich a thermoconductive plate 15 between itself and the heater 11. An introduction pipe 13 and a discharge pipe 14 are connected to the refrigerant jacket 12 so that a refrigerant supplied through the introduction pipe 13 flows through the refrigerant jacket 12 to be discharged from the discharge pipe 14. The bottom surface of the susceptor 8 is supported by a ground member 2a constituting a part of the inner wall of the vacuum container 2.

The susceptor 8 has, for example, inner conductive sticks 16, 17a, and 17b and an outer conductive pipe 18 connected thereto. Through these sticks and pipe, the susceptor 8 receives a high frequency electricity generated by a first high frequency power source 50 to function as the lower electrode for leading plasma into a wafer W in the vacuum container 2. The inner conductive sticks 16, 17a and 17b, and the outer conductive pipe 18 all function as a power feeding bar 19 for supplying electricity to the lower electrode.

The inner conductive stick 16 is connected to the conductive sheet 10a comprised in the electrostatic chuck 10 in order to transmit a high frequency electricity generated by the first high frequency power source 50 and a direct current voltage generated by a direct current power source 52. The inner conductive sticks 17a and 17b are connected to the heater 11 in order to transmit electricity having a commercial frequency supplied from a commercial power source 53. The outer conductive pipe 18 is a pipe arranged so as to cover the inner conductive sticks 16, 17a and 17b.

As shown in FIG. 1, a matching box 20 including a matching circuit section 21 is provided between the susceptor 8 and the first high frequency power source 50, direct current power source 52, and commercial power source 53. The power feeding bar 19 is drawn out from the outer wall of the side surface of the vacuum container 2, so that the matching box 20 can be attached thereto.

Figure 3:
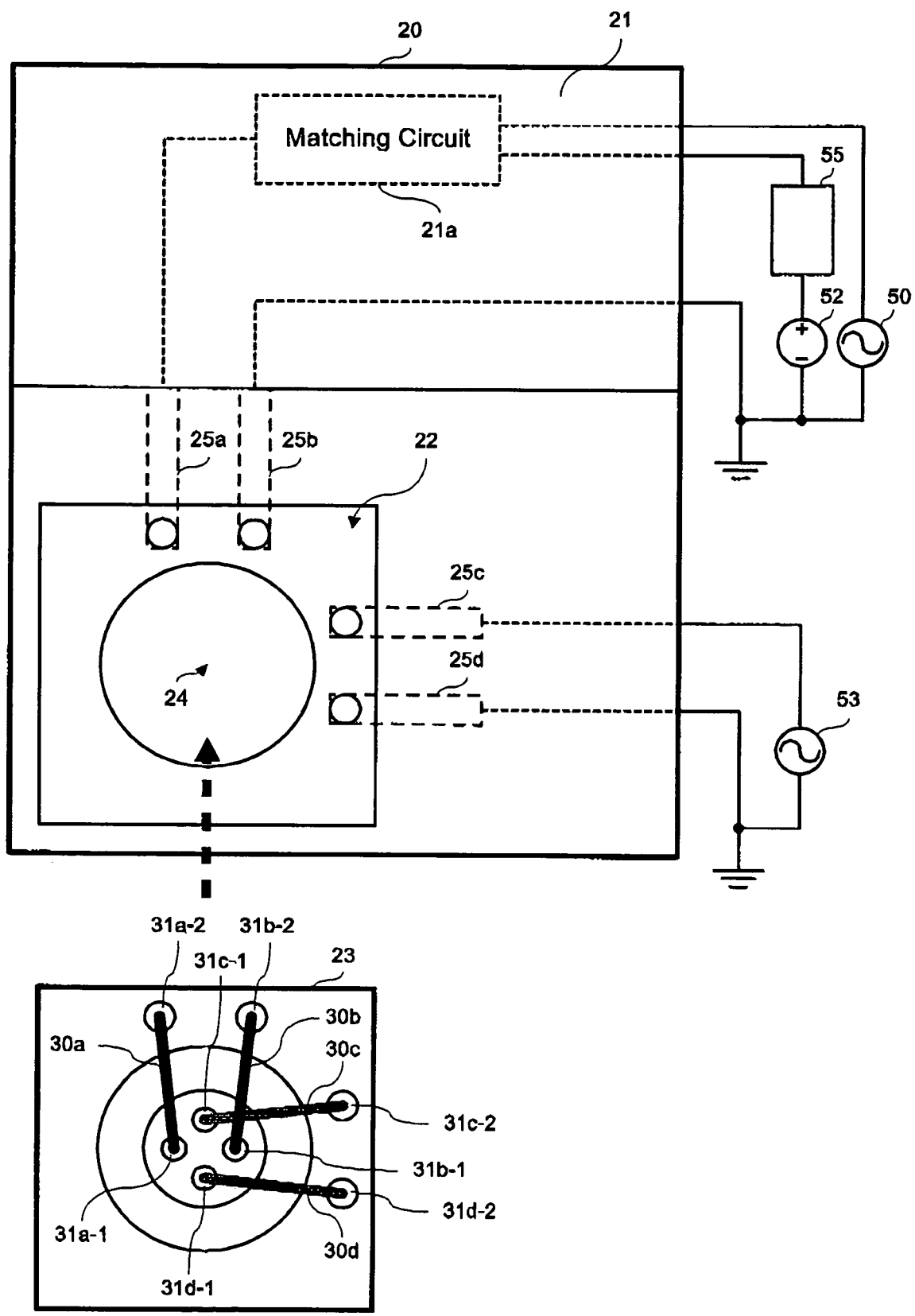
FIG. 3 is a diagram showing an example of a structure of a matching box and an example of inner wirings of a contact device.

FIG. 3 is a front elevation showing an example of the structure of the matching box 20. As illustrated, the matching box 20 comprises the matching circuit section 21 and a contact device insertion section 22. The matching box 20 is connected to the first high frequency power source 50 and the commercial power source 53. Further, the matching box 20 is connected to the direct current power source 52 via a filter circuit 55 which is constituted by an LPF (Low Pass Filter) or the like.

The matching circuit section 21 is for matching an output impedance of the first high frequency power source 50 and an input impedance of the susceptor 8 functioning as the lower electrode. Further, the matching circuit section 21 superimposes a voltage for leading in plasma which is received from the first high frequency power source 50 on a direct current voltage which is received from the direct current power source 52 via the filter circuit 55, and outputs the superimposed voltage.

The contact device insertion section 22 is a slot by which a contact device 23 whose internal wirings are moduled is fixed to the matching box 20. The contact device 23 is provided at its innermost portion, with a power feeding bar draw-out portion 24 which is constituted by an opening through which the power feeding bar 19 can be drawn out from the back The contact device insertion section 22 is provided with electrodes 25 at predetermined positions, for establishing electrical connection with the power feeding bar 19 by coming into contact with a lead-out terminal of each wiring contained in the contact device 23.

To be more specific, the electrodes 25 includes a first electrode 25a to be connected to the inner conductive stick 16, a second electrode 25b to be connected to the outer conductive pipe 18, and third and fourth electrodes 25c and 25d to be connected to the inner conductive sticks 17a and 17b by insertion of the contact device 23. The first and second electrodes 25a and 25b function as output terminals of the matching circuit section 21 by being connected to the matching circuit section 21, enabling supply to the electrostatic chuck 10 of a voltage for leading in plasma which is transmitted while being superimposed on a direct current voltage. Note that the second electrode 25b, which is connected to the outer conductive pipe 18, is grounded. The third and fourth electrodes 25c and 25d are connected to the commercial power source 53, for enabling supply of electricity having a commercial frequency to the heater 11. A filter circuit constituted by an LPF or the like for preventing infiltration of a high frequency electricity may be provided between the third and fourth electrodes and the commercial power source 53.

FIG. 3 also shows an example of wirings 30 which are arranged inside the contact device 23 for connecting the power feeding bar 19 with the electrodes 25. As illustrated, the contact device 23 has wirings 30a to 30d built therein as a three-dimensional circuit. The wiring 30a is connected to a lead-out terminal 31a-1 provided in an exposed manner to come in contact with the inner conductive stick 16, and to a lead-out terminal 31a-2 provided in an exposed manner to come in contact with the first electrode 25a The wiring 30b is connected to a lead-out terminal 31b-1 provided in an exposed manner to come in contact with the outer conductive pipe 18, and to a lead-out terminal 31b-2 provided in an exposed manner to come in contact with the second electrode 25b. The wiring 30c is connected to a lead-out terminal 31c-1 provided in an exposed manner to come in contact with the inner conductive stick 17a, and to a lead-out terminal 31c-2 provided in an exposed manner to come in contact with the third electrode 25c. The wiring 30d is connected to a lead-out-terminal 31d-1 provided in an exposed manner to come in contact with the inner conductive stick 17b, and to a lead-out terminal 31d-2 provided in an exposed manner to come in contact with the fourth electrode 25d.

A shower head 5 having multiple gas ejection holes is provided on the ceiling portion of the vacuum container 2 that is opposite to a placement surface of the susceptor 8 shown in FIG. 1, for placing a wafer W. The circumference of the shower head 5 is fixed by bolts and the like, and is covered by an insulation member 6 which is formed into an annular shape. The insulation member 6 is constituted by, for example, quartz whose surface is covered with an insulation film made of alumina ($Al_2O_3$) ceramics having a high corrosion-resistant property.

Figure 4:
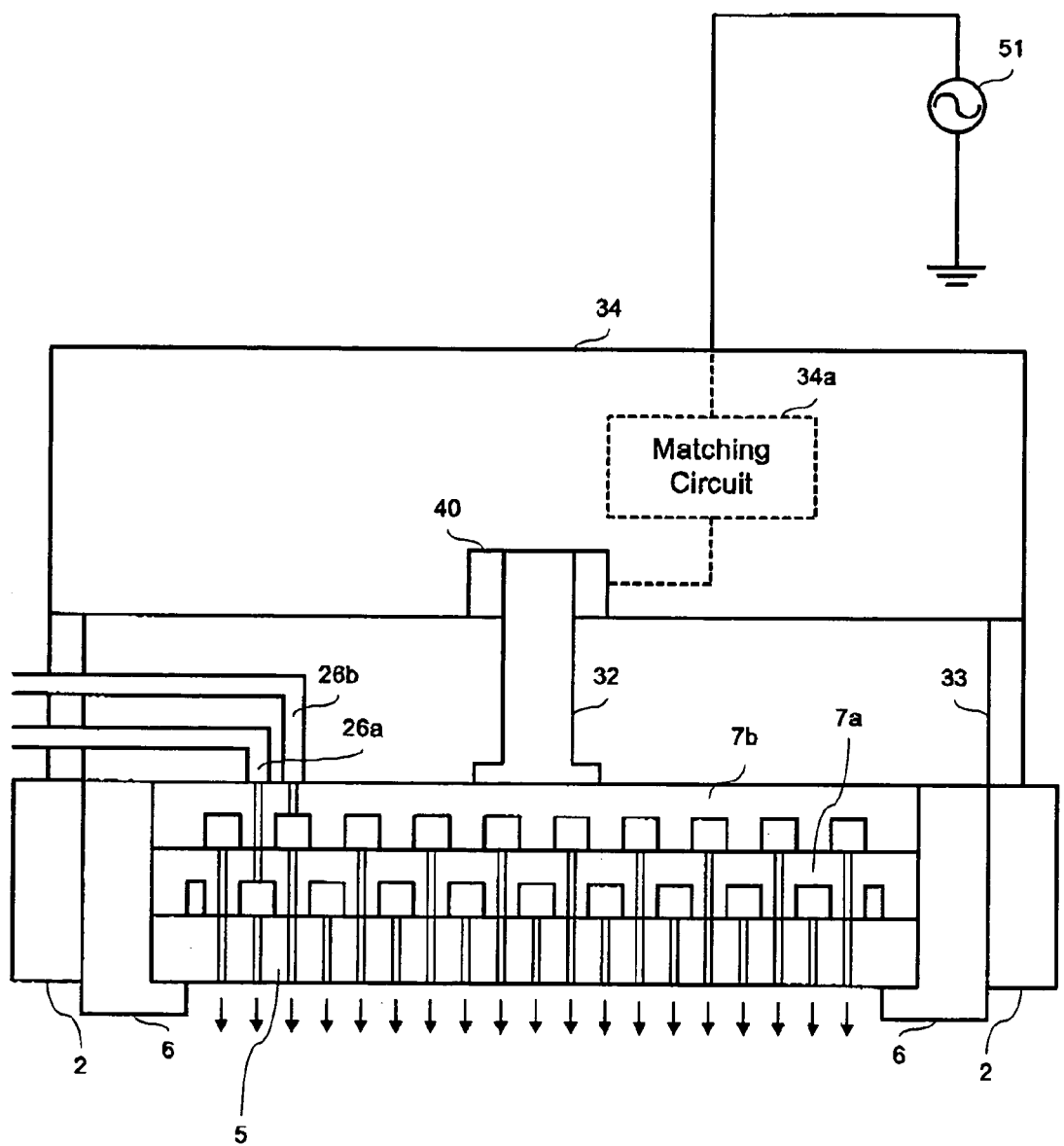
FIG. 4 is a diagram showing an example of a structure of an upper portion of a vacuum container.

FIG. 4 is a diagram showing an example of the structure of the upper portion of the vacuum container 2 in detail. For example, two diffusion plates 7a and 7b are arranged at the upper portion of the shower head 5, and supplied with a plasma generation gas, a material gas, etc. from gas pipes 26a and 26b which are connected to the upper portion of the diffusion plates. A gas pipe 26 including the gas pipes 26a and 26b is connected to a gas supply source 29 via a valve 27 and an MFC (Mass Flow Controller)$_{28}$, etc. as shown in FIG. 1, for enabling supply of material gases such as $SiH_4$ and $O_2$, and a plasma generation gas such as an Ar gas, etc. from the shower head 5 into the vacuum container 2. The gas pipe 26, the valve 27, the MFC 28, and the gas supply source 29 may be provided in an appropriate plural number in accordance with kinds of gases to be supplied into the vacuum container 2, but only one of each of them is shown in FIG. 1. Further, the number and structure of the diffusion plates 7a and 7b may be appropriately changed in accordance with kinds, etc. of the gases to be supplied from the gas supply source 29.

A power feeding bar 32 is connected and fixed by screws or the like onto the upper central area of the diffusion plate 7b, for supplying a high frequency electricity generated by a second high frequency power source 51 to the shower head 5 and thereby making the shower head 5 function as an upper electrode for generating plasma of a material gas, etc inside the vacuum container 2.

An impedance matching device 34 is placed at a space above the vacuum container 2 via the shield box 33. The impedance matching device 34 is for matching an output impedance of the second high frequency power source 51 and an input impedance to the shower head 5 as the upper electrode, and has a socket 40 into which the power feeding bar 32 is inserted to be fixed thereinto.

Figure 5:
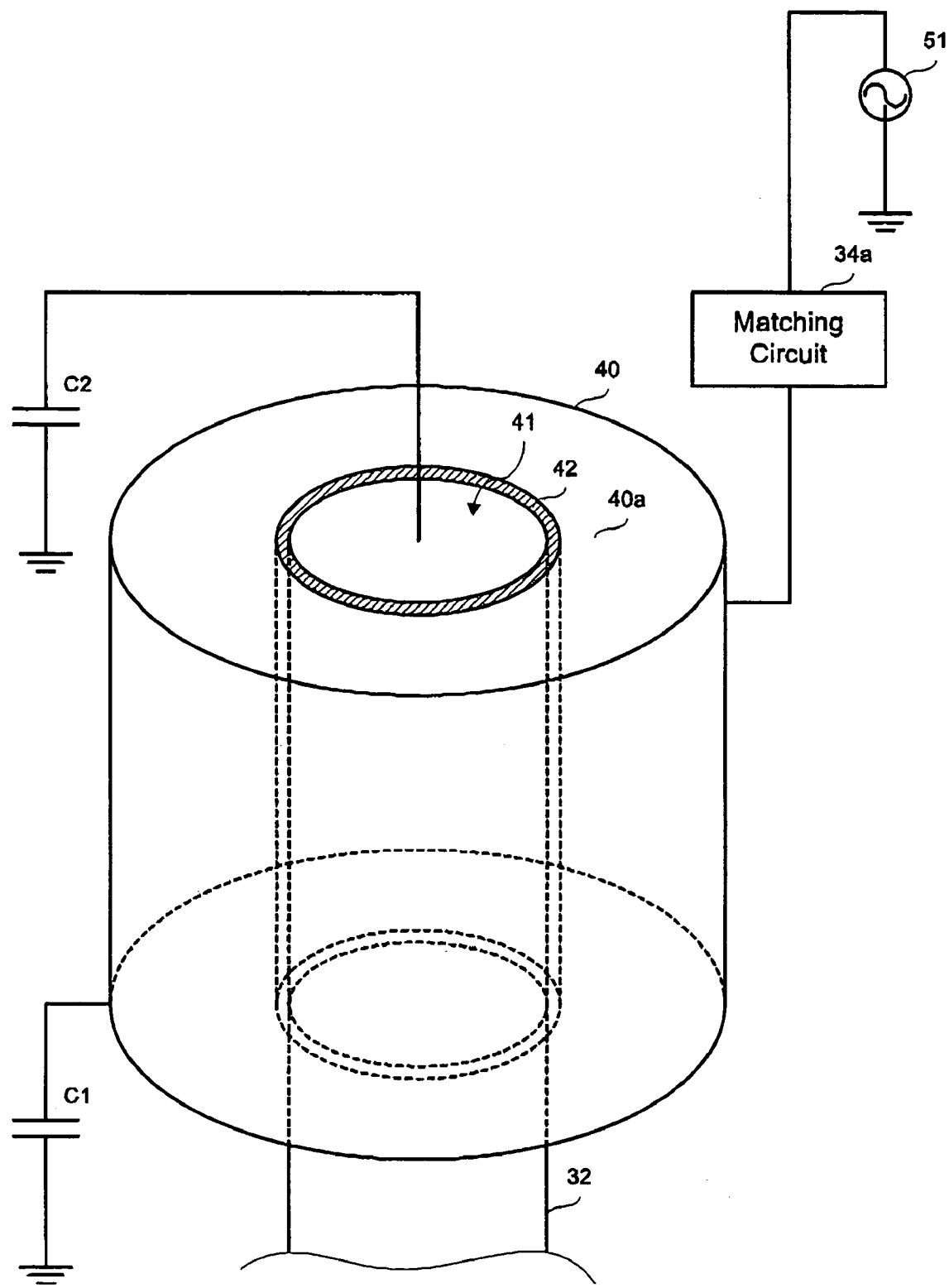
FIG. 5 is a diagram showing insertion parts of a socket and power feeding bar in detail.

FIG. 5 is a diagram specifically showing the insertion parts of the socket 40 and power feeding bar 32. The socket 40 comprises in the center of a metal body 40a formed into a cylindrical structure, an insertion hole 41 for holding the power feeding bar 32 inserted thereinto. The internal wall of the insertion hole 41 is provided with a cover layer 42 made of an insulation material such as fluorine resin, for example, polytetrafluoroethylene [Teflon (Registered Trademark)], etc. That is, the power feeding bar 32 and the socket 40 are electrically insulated, so that electricity of an alternating current component may only be conducted to the power supply source 32 by inductive coupling. The socket 40 is grounded via a capacitor C1 for compensating for the reactance component of the impedance and for insulating a direct current component, and the power feeding bar 32 inserted into the insertion hole 41 is grounded via a capacitor C2.

An operation of the plasma treatment apparatus according to the embodiment of the present invention will be explained below.

In order to process a wafer W by the plasma treatment apparatus 1, the shield box 33 and the impedance matching device 34 are placed above the vacuum container 2. At this time, the power feeding bar 32 that is connected to the diffusion plate 7b is inserted into the insertion hole 41 of the socket 40 provided at the output portion of the impedance matching device 34 in the state where the cover layer 42 intervenes.

Figure 6:
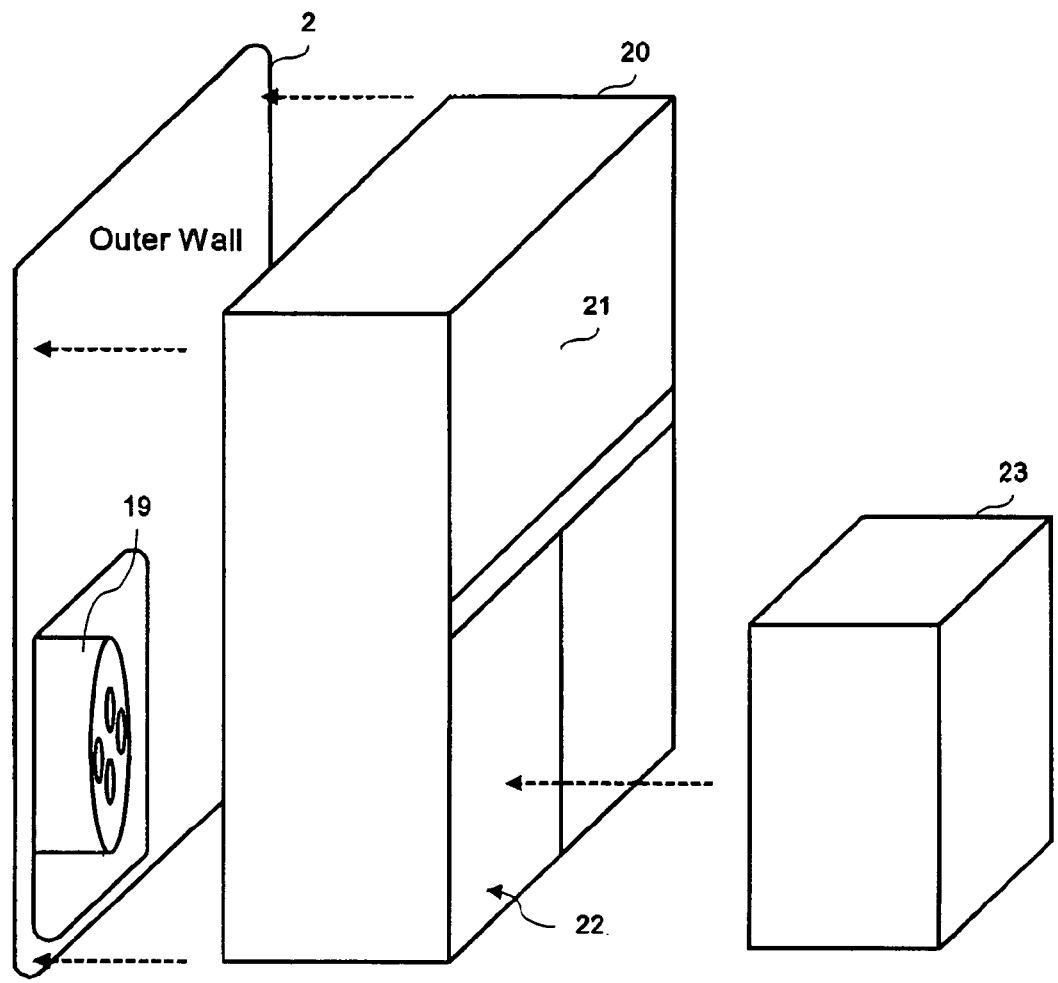
FIG. 6 is a diagram for explaining an operation for attaching a matching box.

The matching box 20 is fixed on the outer wall of the side surface of the vacuum container 2 by screws. As shown in FIG. 6, the matching box 20 is fixed on the outer wall of the side surface of the vacuum container 2 in a state where a space margin is retained between the matching box 20 and the power feeding bar 19 connected to the susceptor 8, by screwing the matching box 20 at screw holes which are provided to the innermost portion of the contact device insertion section 22 and a frame. At this time, the power feeding bar 19 is drawn out from the power feeding bar drawn-out portion 24 into the contact device insertion section 22, so that it is exposed at a certain position. Electric contact between the external circuit constituted by the matching circuit section 21, etc. and the power feeding bar 19 is established by inserting the contact device 23 into the contact device insertion section 22 after the matching box 20 is fixed on the outer wall of the side surface of the vacuum container 2.

When the attaching of the matching box 20 and the impedance matching device 34 is completed in this way, a wafer W is transported from an unillustrated load lock room and placed on the susceptor 8. At this time, the wafer W is attractively fixed by applying a direct current voltage generated by the direct current power source 52 to the conductive sheet 10a of the electrostatic chuck 10. Then, the pump 4 is driven to evacuate the inside space of the vacuum container 2 to a predetermined vacuum pressure. When the predetermined vacuum pressure is reached, the valve 27 is opened, and a predetermined gas supplied form the gas supply source 29, for example, a plasma generation gas such as an Ar gas is introduced with its flow rate controlled by the MFC 28 into the gas pipe 26, then supplied into the vacuum container 2 by the shower head 5, and kept at a predetermined pressure.

The inside space of the vacuum container 2 is heated by the heater 11, and predetermined material gases, for example, an $SiH_4$ gas and an $O_2$ gas to be used as process gases are supplied from the gas supply source 29. The heater 11 heats the inside space of the vacuum container 2 such that the temperature of the wafer W reaches the process temperature within, for example, 400° C. to 600° C.

The first and second high frequency power sources 50 and 51 are activated to start supplying high frequency electricity, so that the material gases, etc. are decomposed into plasma and a stacked film is deposited on the wafer W. At this time, the first high frequency power source 50 applies a negative bias voltage in order to implant ions into the wafer W. The frequency of the first high frequency power source 50 is determined based on the vibration frequency, etc. of plasma ions in the vacuum container 2, and set to the maximum of approximately 10 MHz and preferably to approximately 2 MHz. The second high frequency power source 51 generates and outputs a high frequency electricity having a predetermined frequency within, for example, 27 MHz to 100 MHz, preferably having a frequency of 60 MHz.

The power feeding bar 32 that is connected to the diffusion plate 7*b*, and the socket 40 are arranged such that the directions of magnetic fields formed by alternating currents flowing through the power feeding bar 32 and the socket 40 respectively are coincident. For example, let it be assumed that a high frequency electricity transmitted from the second high frequency power source 51 flows an alternating current in the socket 40 and thereby a magnetic field is formed concentrically to the circumferential direction of the power feeding bar 32. In this case, an induced electromotive force is caused in the power feeding bar 32, thereby a high frequency electricity is conducted to the shower head 5 functioning as the upper electrode.

Figure 7:
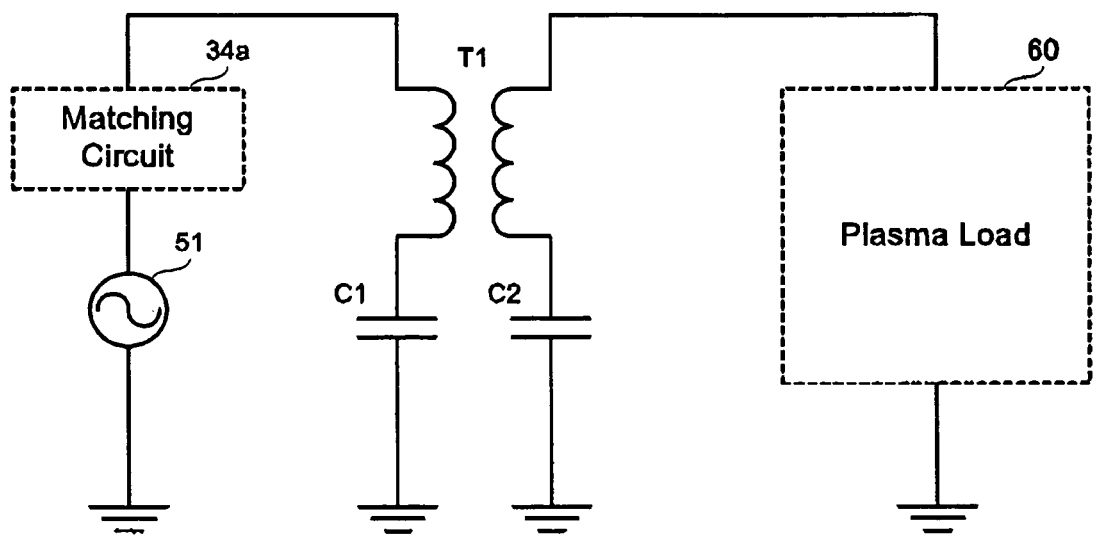
FIG. 7 is diagram showing an equivalent circuit of a path for transmitting a high frequency electricity from a second high frequency power source to a shower head.
Figure 8:
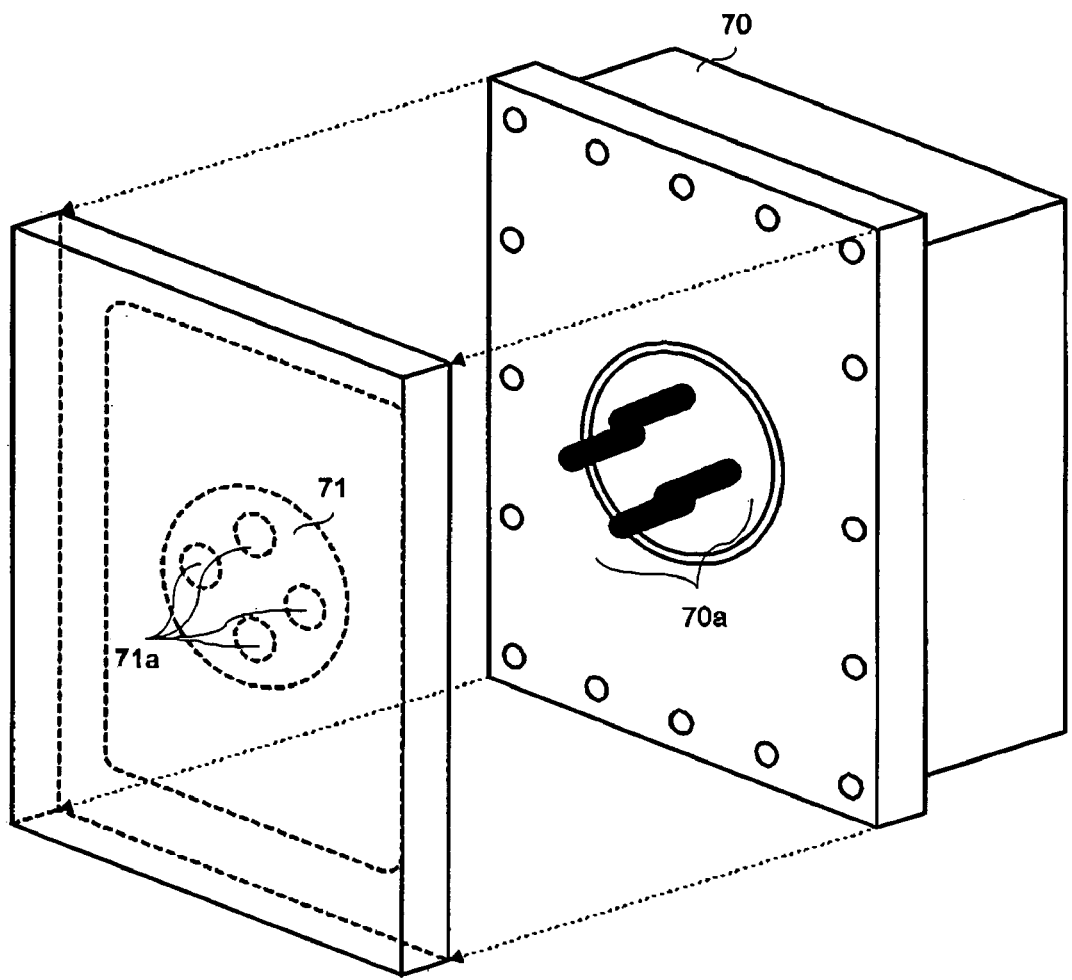
FIG. 8 is a diagram for explaining a conventional matching box.

That is, the output portion of the impedance matching device 34 demonstrates an electrical characteristic equivalent to a transformer T1 shown in FIG. 7, and can conduct a high frequency electricity supplied from the second high frequency power source 51 to the shower head 5 as the upper electrode via the power feeding bar 32. Here, the socket 40 corresponds to the primary winding of the transformer T1 and the power feeding bar corresponds to a secondary winding of the transformer T1. A plasma load 60 shown in FIG. 7 includes the impedances of the power feeding bar 32 and shower head 5, and the impedance of the plasma generated in the process space in the vacuum container 2.

Since, as described above, the socket 40 and the power feeding bar 32 are insulated by the cover layer 42, there is inherently no need for concern for the contact resistance, and a high frequency electricity can be transmitted from the second high frequency power source 51 with an electrically stable characteristic.

In a case where, for example, an SiH$_4$ gas and an O$_2$ gas are supplied as material gases, these gases are ionized in the process space in the vacuum container 2, and an SiO$_2$ film is deposited on the wafer W. When the deposition of the stacked film ends, the supply of the discharge electricity, the introduction of the material gases, and the heating of the inside space of the vacuum container 2 are stopped, and the inside space of the vacuum container 2 is sufficiently purged and cooled. Thereafter, the wafer W is taken out.

As explained above, according to the present embodiment, electric contact between the power feeding bar 19 and the external circuit is established by fixing the matching box 20, when it is to be attached to the outer wall of the side surface of the vacuum container 2, at a position allowing the matching box 20 a space margin between itself and the power feeding bar 19, and then by inserting the contact device 23 into the contact device insertion section 22. Because of this, it is possible to reduce the impact to be applied to the connecting parts of the matching box 20 and power feeding bar 19 at the time the matching box 20 is attached. Consequently, it is possible to attach the external circuit to the power feeding bar 19 physically stably with the power feeding bar 19 and the contact device 23 prevented from being destroyed.

Further, according to the present embodiment, the power feeding bar 32 is inserted into the insertion hole 41 in a state where the socket 40 provided at the output portion of the impedance matching device 34 has the intervention of the cover layer 42 made of an insulation material. This makes it unnecessary to concern for contact resistance at the insertion part of the power feeding bar 32. In the meantime, since a high frequency electricity is conducted to the upper electrode by inductive coupling, a circuit such as the impedance matching device 34, etc. can be attached electrically stably.

The present invention is not limited to the above-described embodiment, but can be variously modified and applied. For example, the above-described embodiment has explained that the cover layer 42 is provided to the socket 40 into which the power feeding bar 32 connected to the upper electrode is to be inserted. However, this is not the only case. That is, connection of a plurality of metal bodies may be established at the power feeding bar 19 connected to the susceptor 8 functioning as the lower electrode, by using a socket which is structured similarly to the socket 40. In this case, a direct current voltage output by the direct current power source 52 may be conducted by electric contact with the power feeding bar 19, and the socket may be supplied with a high frequency electricity, etc. generated by the first high frequency power source 50.

The structure of the contact device 23 can arbitrarily be changed in accordance with the kinds of power sources for supplying electricity to the susceptor 8 as the lower electrode. A structure provided with lead-out terminals and electrodes for establishing electric contact between the power feeding bar 19 and an external circuit and having wirings laid may be used.

The structure of the plasma treatment apparatus 1 may also arbitrarily be changed. For example, the plasma treatment apparatus 1 may comprise a coil, a permanent magnet or the like for causing a predetermined magnetic field around the vacuum container 2, in order to process a wafer W by utilizing electron cyclotron resonance.

Further, the present invention is not limited to a plasma treatment apparatus for carrying out a plasma CVD process, but may be applied to an etching apparatus, an ashing apparatus, etc. as long as they are apparatuses for plasma-processing a process target such as a semiconductor wafer, an LCD substrate, and a solar battery substrate by supplying a high frequency electricity to a shower head and a susceptor.

This application is based on Japanese Patent Application No. 2001-380183 filed on Dec. 13, 2001 and including specification, claims, drawings and summary. The disclosure of the above Japanese Patent Application is incorporated herein by reference in its entirety.

INDUSTRIAL APPLICABILITY

The present invention can be applied to a processing apparatus for carrying out a plasma process such as a semiconductor manufacturing apparatus, a liquid crystal display element manufacturing apparatus, etc.

What is claimed is:

1. A plasma treatment apparatus comprising:
a vacuum container (2) in which a process target is processed with use of a gas turned into plasma;
plasma generation electrodes (8, 5) which are arranged in said vacuum container;
high frequency power sources (50, 51) which generate a high frequency electricity to be supplied to said plasma generation electrodes;
power feeding bars (19, 32) which conduct a high frequency electricity generated by said high frequency power sources to said plasma generation electrodes;
matching boxes (20, 34) which include matching circuits (21*a*, 34*a*) for matching input impedances to said plasma generation electrodes and output impedances of said high frequency power sources; and contact devices (23, 40) which establish electric contact between output terminals of said matching circuits (21*a*, 34*a*) for outputting a high frequency electricity and input terminals of said power feeding bars for inputting the high frequency electricity, wherein said contact devices are structured such that they can establish electric contact between said matching circuits and said power feeding bars after positioning of said power feeding bars (19, 32) and said matching boxes (20, 34) is completed.

2. The plasma treatment apparatus according to claim 1, wherein positioning of said power feeding bar (19) and said matching box (20) is completed by attaching said matching box (20) onto an outer wall of said vacuum container (2).

3. The plasma treatment apparatus according to claim 1, wherein:

said matching box (20) comprises a slot (22) into which said contact device (23) can be inserted; and electric contact between said matching circuits (21*a*, 34*a*) and said power feeding bars is established by inserting said contact device (23) into said slot (22) in a state where said matching box (20) is attached to the outer wall of said vacuum container (2).

4. The plasma treatment apparatus according to claim 1, comprising a heater (11) which heats the process target to be processed in said vacuum container (2), wherein said contact device (23) is structured such that it can establish electric contact for supplying said heater with electricity supplied from a commercial power source.

5. The plasma treatment apparatus according to claim 4, wherein said matching box comprises a coupler (40) which inserts thereinto said power feeding bar (32) connected to said plasma generation electrode in order to fix and support said power feeding bar (32) to and by said impedance matching device (34), and said coupler (40) comprises a cover layer (42) made of an insulation material at an insertion portion (41) of said power feeding bar (32).

6. The plasma treatment apparatus according to claim 5, wherein said coupler (40) is capable of supplying a high frequency electricity generated by said high frequency power source to said plasma generation electrode (5) by inductive coupling with said power feeding bar (32).

7. A plasma treatment apparatus comprising:

a vacuum container (2) in which a process target is processed with use of a gas turned into plasma;

a plasma generation electrode (5) which is arranged in said vacuum container;

a high frequency power source (51) which generates a high frequency electricity to be supplied to said plasma generation electrode;

an impedance matching device (34) which is connected between said plasma generation electrode and said high frequency power source in order to match an impedance to said plasma generation electrode and an output impedance of said high frequency power source; and a coupler (40) which inserts thereinto a power feeding bar (32) connected to said plasma generation electrode to fix and support said power feeding bar (32) to and by said impedance matching device (34), wherein said coupler (40) comprises a cover layer (42) made of an insulation material at an insertion portion (41) of said power feeding bar (32).

8. The plasma treatment apparatus according to claim 7, wherein said coupler (40) is capable of supplying a high frequency electricity generated by said high frequency power source to said plasma generation electrode (5) by inductive coupling with said power feeding bar (32).

* * * * *